May 6, 1952 W. M. WEBSTER, JR 2,595,496

CASCADE-CONNECTED SEMICONDUCTOR AMPLIFIER

Filed Jan. 22, 1949

INVENTOR
WILLIAM M. WEBSTER, JR
BY H. L. Newton
ATTORNEY

Patented May 6, 1952 2,595,496

UNITED STATES PATENT OFFICE 2,595,496

CASCADE-CONNECTED SEMICONDUCTOR AMPLIFIER

William M. Webster, Jr., Princeton, N. J., assignor to Radio Corporation of America, a corporation of Delaware Application January 22, 1949, Serial No. 72,152

4 Claims. (Cl. 179—171)

This invention relates generally to semi-conductor amplifiers and particularly to cascade-connected amplifier stages of the three-electrode semi-conductor type.

In the past, many attempts have been made to construct an amplifier which does not include a vacuum tube. One of the most recent amplifiers of this type utilizes a three-electrode semi-conductor. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of a semi-conducting material such as silicon or germanium which is provided with two closely adjacent point electrodes, called "emitter" and "collector" electrodes, in contact with one surface region of the material and a "base" electrode which provides a large area, low-resistance contact with another surface region of the semi-conductor. The input circuit of the amplifier described in the publication referred to above is connected between the emitter electrode and the base electrode while the output circuit is connected between the collector electrode and the base electrode. The base electrode is therefore the common input and output electrode and may be grounded.

The published circuit of the three-electrode semi-conductor amplifier has a number of disadvantages. For example, the power gain is comparatively low. Furthermore, the input impedance is of the order of 100 to 500 ohms, while the output impedance is of the order of 10,000 ohms or more. Thus, a step-down transformer is normally required between successive stages of a cascade amplifier utilizing transistors. Such a low input impedance is also undesirable since an amplifier should present a substantial minimum load to any signal source for reasons which are well known.

A bias source is connected between the emitter and base electrodes for biasing them in a relatively conducting polarity. This is the reason why the input impedance is low. On the other hand, the output impedance is high because the output signal is derived between the collector and base electrodes which are biased by another voltage source in a relatively non-conducting polarity.

It is desirable to provide cascade-connected semi-conductor amplifiers which do not require transformers or other networks for matching the output impedance of one stage to the input impedance of the succeeding stage. Such cascade-connected amplifiers of the semi-conductor type should have high voltage gain which should be higher than the combined voltage gain of the individual amplifier stages and a high power gain. Preferably, the input impedance of the cascade-connected stages should be of the same order as the output impedance. Furthermore, the input impedance should amount to at least a few thousand ohms so that the driving power is minimized.

It is the principal object of the present invention, therefore, to provide a cascade-connected semi-conductor amplifier having a high power gain, and a much higher voltage gain than the combined voltage gain of the individual amplifier stages.

A further object of the invention is to provide a two-stage semi-conductor amplifier in which one of the output electrodes of the first stage is conductively connected to one of the input electrodes of the second stage and in which the input impedance of the first stage is of the same order of magnitude as the output impedance of the last stage.

Another object of the invention is to utilize one three-electrode semi-conductor amplifier as an impedance matching device for another semi-conductor amplifier, the impedance matching device having a high power gain.

A cascade-connected amplifier in accordance with the present invention comprises a first semi-conductor provided with a first base electrode, a first emitter electrode and a first collector electrode. A second semi-conductor is provided with a second base electrode, a second emitter electrode and a second collector electrode. The contact areas of the base electrodes are relatively large compared to the contact areas of the emitter and collector electrodes. Associated base and emitter electrodes are biased by a source of potential in a relatively conducting polarity while associated base and collector electrodes are biased in a relatively non-conducting polarity. The input signal is applied to the first base electrode, that is, it is effectively impressed between the first base electrode and the first collector electrode. The two emitter electrodes are conductively connected together and the output signal is derived from the second collector electrode, that is, it is obtained effectively between the second collector electrode and the second base electrode.

A cascade-connected amplifier of this type will have a power gain which is slightly larger than the combined power gain of the individual amplifier stages while its voltage gain is considerably higher than that of the two stages taken individually.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Fig. 1 is a circuit diagram of a known three-electrode semi-conductor amplifier;

Fig. 2 is a circuit diagram of a three-electrode semi-conductor amplifier of the type disclosed and claimed in the copending application to L. E. Barton filed on December 30, 1948, Serial No. 68,248 and assigned to the assignee of this application;

Figure 1:
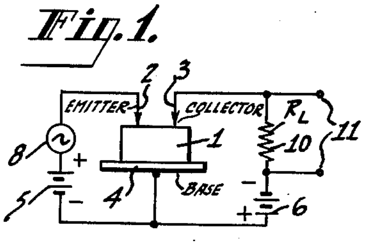

Referring now to the drawing, in which like components have been designated by the same reference numerals, and particularly to Fig. 1, there is illustrated a previously-known, three-electrode, semi-conductor device arranged as an amplifier. The amplifier comprises a block 1 of semi-conducting material which may consist, for example, of germanium or silicon containing a small but sufficient number of atomic impurity centers or lattice imperfections, as commonly employed for best results in semi-conductors devices (such as crystal rectifiers). Germanium is the preferred material for block 1 and, as will be further explained below, may be prepared so as to be an electronic N type semi-conductor. The surface of semi-conducting block 1 may be polished and etched in the manner explained in the paper by Bardeen and Brattain referred to. It is also feasible to utilize the germanium block from a commercial high-back-voltage germanium rectifier such as the type 1N34. In this case, further surface treatment may not be required.

Semi-conductor 1 is provided with three electrodes, viz., emitter electrode 2, collector electrode 3 and base electrode 4 as indicated in Fig. 1. Emitter electrode 2 and collector electrode 3 may be point contacts which may consist, for example, of tungsten or Phosphor-bronze wires having a diameter of the order of 2 to 5 mils. The emitter and collector electrodes 2, 3 are ordinarily placed closely adjacent to each other and may be separated by a distance of from 2 to 10 mils. Base electrode 4 provides a large-area low-resistance contact with the bulk material of semi-conductor 1.

A suitable voltage source such as battery 5 is connected between emitter electrode 2 and base electrode 4 and is of such a polarity as to bias them in a relatively conducting direction or polarity. Accordingly, when the semi-conductor is of the N type, emitter electrode 2 should have a positive potential with respect to base electrode

4 as illustrated. Another voltage source such as battery 6 is provided between collector electrode 3 and base electrode 4 and has such a polarity as to bias them in a relatively non-conducting direction or polarity. Consequently, since an N type semi-conductor is assumed for Fig. 1, collector electrode 3 should have a negative potential with respect to base electrode 4. The source of the input signal indicated at 8 is connected in the emitter lead, that is, between emitter electrode 2 and base electrode 4. The output load $R_L$ indicated by resistor 10 is connected between collector electrode 3 and base electrode 4 and is in series with bias battery 6. The output signal may be derived across load resistor 10 from output terminals 11.

At the present time it is not possible to give a definite theory accounting for all details of the operation of three-electrode, semi-conductor amplifier. It is believed, however, that the following explanation will be helpful for a better understanding of the present invention. A semi-conductor is a material whose electrical conductivity lies intermediate the conductivity of good conductors and that of good insulators. The materials which have been widely used in crystal rectifiers and which are also used in the three-electrode, semi-conductor amplifier are of crystalline type, probably consisting of an aggregate of small crystals. Although conduction in some materials may be ionic in nature, where the actual motion of electrically charged atoms represents the flow of current, the present invention is of particular value in connection with those materials in which the atoms remain relatively fixed while conduction takes place by electrons. These latter materials are called electronic semi-conductors. It is appreciated that ionic conductors can also be of use in amplifier devices so that, although the discussion and explanation of operation is confined to electronic semi-conduction of the type found for example in silicon or germanium, the invention is not to be construed as so limited, except as defined in the appended claims.

For some time it has been assumed that there are two types of electronic semi-conductors, one called the N type (negative type) while the other is called the P type (positive type). The N type semi-conductor behaves as if there are present a limited number of free negative charges or electrons which conduct the current somewhat similarly to the manner in which current conduction takes place in a metal. Such material, in a well-ordered crystal lattice, would not be expected to have many free electrons. It is therefore assumed that the free electrons which account for the conduction are donated by impurities or lattice imperfections which may be termed "donors." Thus, in an N type silicon crystal which is a semi-conductor, the donor may consist of small impurities of phosphorus. Since silicon has four valence electrons and phosphorus five, the excess valence electron of the occasional phosphorus atom is not required for the tetrahedral binding to adjacent silicon atoms in the crystal and hence is free to move. The current in an N type semi-conductor accordingly flows as if carried by negative charges (electrons).

In the P type of semi-conductor, current conduction appears to take place as if the carriers were positive charges. This is believed to be due to the presence of impurities which will accept an electron from an atom of the semi-conductor. Thus, a P type silicon crystal may contain a few boron atoms which act as "acceptors." Since boron has only three valence electrons, it will accept an electron from a silicon atom to complete the atomic bond. There is, accordingly, a "hole" in the crystalline structure which might be considered a virtual positive charge. Under the influence of an external electrical field the hole or the holes will travel in the direction that a positive charge would travel.

If two contacts are made to an electronic semi-conductor of N or P type, and if these contacts are of similar material and of equal area, an impressed voltage will lead to current flow of about the same magnitude with either polarity of voltage. It will ordinarily be found that there is a non-linear relation between current and voltage, as the voltage is increased. This non-linear effect was first explained as being a result of the disturbance of the internal electronic energy levels of the crystal lattice due to the metal contact which was said to produce a so-called barrier layer, or energy hump. It could be shown that, with an N-type crystal, an increasing positive potential on the metal contact caused a change in the barrier-layer energy hump in such a direction as to allow electrons to flow relatively freely into the metal. A metal contact having a negative potential, however, would alter the field so as to repel the internal conduction electrons, and the only current flow would then be due to the escape of electrons from the metal over the energy hump of the barrier layer; this current flow would be quite small. The explanation was sufficient to explain crudely the observed phenomena as well as those with P-type material, in which the effects are similar with the opposite polarity of metal contact. Although, as indicated, there is a hypothetical rectification effect at the contact to either N or P type material, the two equal contacts will cancel out this effect and the current flow is independent of polarity and relatively small.

In the actual two-electrode rectifier (crystal diode), one contact is made to the bulk crystal and is of such large area that its resistance is extremely low for either direction of current flow. Thus non-linear effects at this large-area contact are not of great significance compared with those at the second contact, which is of very small area (such as that of a wire having a sharp point). In this way, the hypothetical barrier layer at the crystal surface near the small-area contact can cause actual rectification. As already indicated, such an unequal contact area device made of an N-type semi-conductor will conduct readily when the small-area contact is positive in polarity and is relatively non-conductive when the small area contact is negative. For a two-electrode rectifier made of a P-type material the situation is reversed.

In the semi-conductor amplifier of 3-electrodes one large-area contact is made to the bulk crystal and two smaller-area contacts are made close to one another on a crystal surface. There are now two possible barrier layers but, even more important, it is believed that current may now flow from one small-area contact to the other one in a way requiring a much more complete explanation of the barrier-layer effect than the one involving only the presence of the metal contact. This will be discussed below in connection with N-type material but it is to be understood that analogous effects may occur with P-type material by appropriate reversal of potentials just as in the rectifier case.

The recently discovered amplifying properties of the three-electrode semi-conductor may be explained by extending the above theory as follows: Let it be assumed that the germanium or silicon crystal used in the device is an N-type semi-conductor throughout its bulk. However, it is now believed that a very thin surface layer of the crystal, closely related to the so-called barrier-layer effect mentioned above, may behave like a P-type semi-conductor. This thin layer of P-type, that is, "hole" conduction, may be caused by a chemical or physical difference in the behavior of the impurities on the surface of the crystal, or it may be caused by a change in the energy levels of the surface atoms due to the discontinuity of the crystal structure at the surface. In any case, an excess of holes is created in this surface layer of the semi-conductor.

Even in the rectifier, the new hypothesis is of value since the original one without the assumption of the P-layer failed to explain the lack of difference in rectification between high and low work function metal contacts and also led to predictions of a higher resistance in the conducting direction of rectifiers than was actually observed. The previous explanation of rectifiers has now been modified by assuming the presence of this surface P-layer on the crystal and furthermore it now seems possible that the rectifying barrier layer exists near the surface region at the P-to-N boundary. Thus, differences of the work functions of metallic points play a negligible role in the rectification, and the relatively larger barrier area now assumed accounts for the low resistance of the crystal in the conducting direction. Furthermore, it is now believed that conduction near the point contact is of the "hole" or virtual positive charge type, while inside the crystal it is of the electron, or negative charge type. For the three-electrode semi-conductor amplifier, under discussion, this new theory is very important since the amplifier behavior is chiefly governed by the "hole" current on the surface of the crystal between the two point contacts.

Because the point contact 2 (of Fig. 1) known as the emitter electrode is biased positively with respect to the crystal 1, conduction readily takes place through the barrier layer to base electrode 4, with "holes" or virtual positive changes moving in the surface layer of the crystal while electrons carry the current in the interior of the crystal. However, since a nearby collector point contact or electrode 3 at a negative potential will cause an electric surface field and attract the positive "holes," the "holes" will not only flow into or through the crystal barrier layer but may also flow directly from emitter electrode 2 to collector electrode 3 along the surface. The collector electrode barrier layer would normally prevent current unless these "holes" are provided by the emitter. Changing the voltage between emitter electrode 2 and the bulk crystal 1 will increase or decrease the emitter current available for flow in the P-type surface layer to the collector electrode 3.

Figure 2:
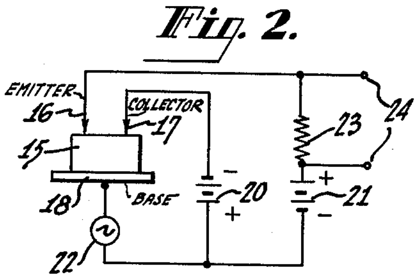

Fig. 2 illustrates a semi-conductor amplifier circuit of the type disclosed and claimed in the Barton application referred to hereinabove. The amplifier comprises semi-conductor 15 provided with emitter electrode 16, collector electrode 17 and base electrode 18. By means of a suitable voltage source such as battery 20 connected between collector electrode 17 and base electrode 18 the two electrodes are biased in a relatively non-conducting polarity. Bias battery 21 is connected between emitter electrode 16 and the positive terminal of battery 20 and biases emitter electrode 16 and base electrode 18 in a relatively conducting polarity. The input signal or signal generator 22 is provided in the base lead, that is, between base electrode 18 and the junction point of batteries 20 and 21. The signal output circuit 23 which may consist of a resistor as shown, is connected in the emitter lead, that is, between emitter electrode 16 and collector electrode 17. The output signal may be derived from output terminals 24 connected across resistor 23.

The amplifier circuit of Fig. 2 has a high input impedance because the input signal is applied to base electrode 18. On the other hand, the output impedance is low because the output signal is derived from emitter electrode 16. The amplifier of Fig. 2 accordingly requires a low driving power and its power gain is good. The voltage gain is approximately unity because the output impedance is so much lower than the input impedance. The power output is small because only a small current will flow in the output circuit. For a detailed analysis of the circuit of Fig. 2 reference is made to the copending application of Barton above referred to.

Figure 3:
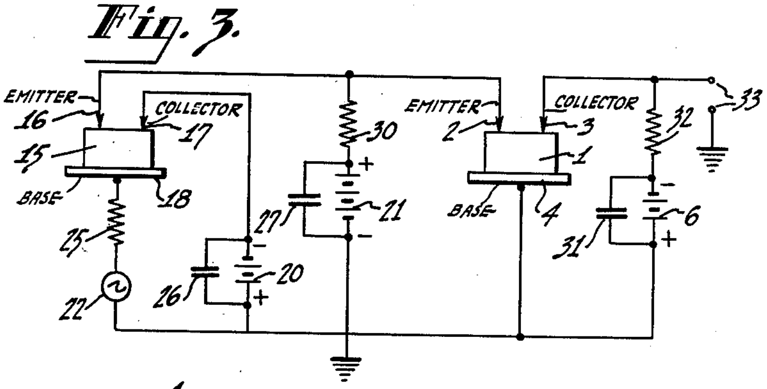
Fig. 3 is a circuit diagram of a cascade-connected, two stage, semi-conductor amplifier embodying the present invention and utilizing the circuits of Figs. 1 and 2.

In accordance with the present invention the amplifier circuits of Figs. 1 and 2 are connected in cascade to obtain a two-stage amplifier having a considerably higher voltage gain than the combined voltage gain of the two individual stages and a power gain which is at least as large as the combined power gain of the two individual stages. The two-stage cascade-connected amplifier of the invention is illustrated in Fig. 3 and comprises a first stage including semi-conductor 15, emitter electrode 16, collector electrode 17 and base electrode 18. The second amplifier stage includes semi-conductor 1, emitter electrode 2, collector electrode 3 and base electrode 4. The input signal developed by signal generator 22 is impressed upon base electrode 18 through base resistor 25. By means of bias battery 20, collector electrode 17 is maintained at a negative voltage with respect to that of base electrode 18, that is, the two electrodes are biased in a non-conducting polarity. Batttery 20 may be bypassed for signal frequency currents by capacitor 26. Emitter electrode 16 is maintained at a conducting polarity with respect to base electrode 18 by battery 21. Battery 21 may also be bypassed for signal frequency currents by bypass capacitor 27. The positive terminal of battery 21 may be connected to emitter electrode 16 through isolating resistor 30. The common terminal of batteries 20 and 21 and of generator 22 may be grounded as shown.

The second amplifier stage has its base electrode 4 connected to ground. Emitter electrode 2 is conductively connected to emitter electrode 16. By means of battery 6, collector electrode 3 and base electrode 4 are biased in a non-conducting polarity. Battery 6 may be bypassed for signal frequency currents by bypass capacitor 31. The output load is represented by resistor 32 arranged between battery 6 and collector electrode 3. The amplified output signal is derived across load resistor 32 and may be obtained from output terminals 33 connected between collector electrode 3 and ground.

The cascade-connected amplifier of Fig. 3 accordingly consists of the amplifier of Fig. 2 having its emitter electrode 16 connected to emitter electrode 2 of the amplifier of Fig. 1. The two-stage amplifier of Fig. 3 has an input impedance represented by resistor 25 which is of the same order of magnitude as the output impedance represented by resistor 32. Resistors 25 and 32 may, for example, have each a resistance of 5,000 ohms. Experiments revealed that the power gain of the two-stage amplifier of Fig. 3 amounts to 36 decibels (db) while its voltage gain was also 36 db. The power gain of each individual amplifier stage 15 and 1 would be 15 db only so that the power gain of the two-stage cascade-connected amplifier is slightly larger than the combined gain of the two individual stages. The voltage gain of the two-stage amplifier is considerably larger than the combined voltage gain of the two individual amplifiers since the amplifier of Fig. 2 has a voltage gain of unity (0 db). One of the two amplifier stages accordingly functions as an impedance matching device for the other amplifier stage, and the impedance matching device has a considerable power gain.

Another advantage of the two-stage cascade-connected amplifier of Fig. 3 is that the two emitter electrodes 16 and 2 are conductively connected together. Accordingly, it is not necessary to provide an impedance matching network between the two amplifier stages. Isolating resistor 30 is not essential for the operation of the amplifier and may therefore be replaced by a choke coil. It is also feasible to provide a two-stage amplifier of the type illustrated in Fig. 3 with a single semi-conducting crystal provided with two base electrodes, two collector electrodes and a single or common emitter electrode. Such a device has been disclosed and claimed in applicant's copending application Serial No. 72,153, filed January 22, 1949, concurrently herewith and assigned to the assignee of this application.

Figure 4:
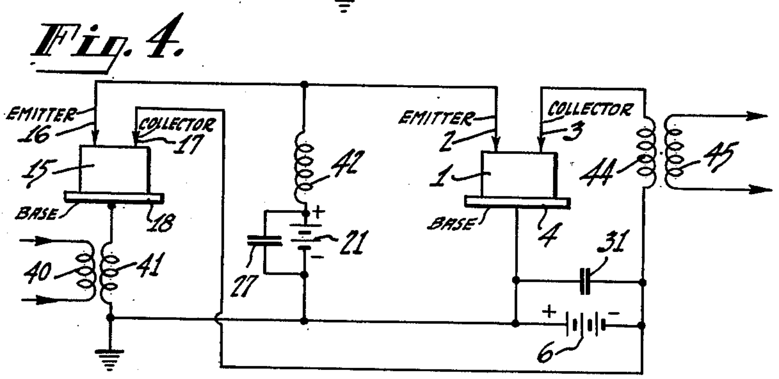
Fig. 4 is a circuit diagram of a modification of the cascade-connected semi-conductor amplifier in accordance with the invention.

A modification of the circuit of Fig. 3 is illustrated in Fig. 4. The input signal is impressed on primary winding 40 of a transformer. The secondary winding 41 of the transformer is connected between base electrode 18 and ground. The two emitter electrodes 16 and 2 are biased by battery 21 which may be bypassed for signal frequency currents by capacitor 27. Choke coil 42 may be provided between battery 21 and emitter electrodes 16 and 2. Collector electrodes 17 and 3 may be biased by a single battery 6 which may be bypassed to ground for signal frequency currents by capacitor 31. The negative terminal of battery 6 is directly connected to collector electrode 17 and is connected through primary winding 44 of the output transformer to collector electrode 3. Primary winding 44 accordingly represents the output impedance. Secondary winding 45 is inductively coupled to primary winding 44, and the amplified output signal may be derived from secondary winding 45. The circuit of Fig. 4 operates in the same manner as that of Fig. 3.

Figure 5:
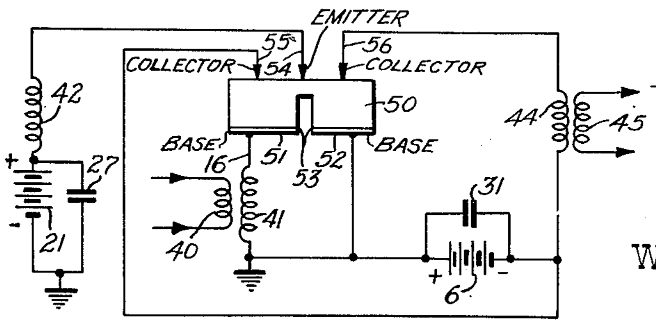
Fig. 5 is a circuit diagram of a cascade-connected semi-conductor amplifier similar to the circuit of Fig. 4 but utilizing a single semi-conductor device.

The circuit of Fig. 5 is identical with the circuit of Fig. 4 except that a single semi-conducting crystal 50 is provided with which are associated two base electrodes 51, 52, two collector electrodes 55, 56 and a single emitter electrode 54. The semi-conducting crystal 50 has a slot 53 to provide a high impedance between the two base electrodes 51, 52. The two-stage amplifier device 50 illustrated in Fig. 5 is identical with the device disclosed and claimed in applicant's copending application above referred to. The operation of the circuit of Fig. 5 is the same as that of Fig. 4.

There has thus been described a two-stage cascade-connected semi-conductor amplifier having a power gain which is slightly higher than the combined power gain of the two individual stages and with a voltage gain which is considerably higher than the combined voltage gain of the two individual stages. The two amplifier stages do not require an impedance matching network and the input impedance may be made to equal the output impedance of the two stage amplifier, the impedances being larger than a thousand ohms.

What is claimed is:

1. A cascade-connected amplifier comprising semi-conductor means provided with a first and a second base electrode and with at least three further electrodes, said base electrodes being in low-resistance contact with said semi-conductor means, said further electrodes being of relatively small area compared to that of said base electrode, means for biasing said first base electrode and a first one of said further electrodes and said second base electrode and a second one of said further electrodes in a relatively non-conducting polarity and for biasing said base electrodes and a third one of said further electrodes in a relatively conducting polarity, means connecting said first one of said further electrodes to a point of fixed potential, means for applying an input signal between said first base electrode and a point of fixed potential, a coupling impedance element connected between said third one of said further electrodes and a point of fixed potential, an output circuit connected between said second one of said further electrodes and a point of fixed potential, and means maintaining said second base electrode at a substantially fixed potential.

2. A cascade-connected amplifier comprising a semi-conductor means provided with a first and second base electrode, with a first and a second collector electrode and with at least one emitter electrode, means for biasing said first base electrode and said first collector electrode and said second base electrode and said second collector electrode in a relatively non-conducting polarity and for biasing said base electrodes and said emitter electrode in a relatively conducting polarity, means connecting said first collector electrode to a point of fixed potential, an input circuit connected to apply said signal between said first base electrode and a point of fixed potential, a coupling impedance element connected between said emitter electrode and a point of fixed potential, an output circuit connected between said second collector electrode and a point of fixed potential, and means maintaining said second base electrode at a substantially fixed potential.

3. A cascade-connected amplifier comprising a first semi-conductor provided with a first base electrode, a first emitter electrode and a first collector electrode, a second semi-conductor provided with a second base electrode, a second emitter electrode and a second collector electrode, means including a source of potential for biasing associated base and emitter electrodes in a relatively conducting polarity and for biasing associated base and collector electrodes in a relatively non-conducting polarity, means connecting said first collector electrode to a point of fixed potential, an input circuit including a source of input signal connected to apply said signal between said first base electrode and a point of fixed potential, said emitter electrodes being conductively connected, a common coupling impedance element connected between said emitter electrodes and a point of substantially fixed potential, said second base electrode being connected to said point of fixed potential, thereby to maintain said second base electrode at said fixed potential, and an output circuit connected between said second collector electrode and said point of fixed potential for deriving the amplified output signal.

4. A cascade-connected two-stage amplifier comprising a first semi-conductor provided with a first base electrode, a first emitter electrode and a first collector electrode, a second semi-conductor provided with a second base electrode, a second emitter electrode and a second collector electrode, means including a source of potential for biasing associated base and emitter electrodes in a relatively conducting polarity and for biasing associated base and collector electrodes in a relatively non-conducting polarity, an input circuit including a source of input signal connected to apply said signal effectively between said first base electrode and said first collector electrode, said emitter electrodes being conductively connected, a common coupling impedance element connected between said emitter electrodes and a point of substantially fixed potential, an output circuit connected effectively between said second collector electrode and said second base electrode for deriving the amplified output signal, and means for maintaining said first collector electrode and said second base electrode each at a substantially fixed potential.

WILLIAM M. WEBSTER, Jr.

REFERENCES CITED

The following references are of record in the file of this patent:

UNITED STATES PATENTS

| Number | Name | Date |
|---|---|---|
| 1,745,175 | Lilienfeld | Jan. 28, 1930 |
| 2,476,323 | Rack | July 19, 1949 |
| 2,517,960 | Barney | Aug. 8, 1950 |
| 2,524,035 | Bardeen | Oct. 3, 1950 |